US012105130B2

United States Patent
Salim et al.

(10) Patent No.: US 12,105,130 B2
(45) Date of Patent: Oct. 1, 2024

(54) MICROWAVE SENSOR USING AUTLER-TOWNES SPLITTING

(71) Applicant: ColdQuanta, Inc., Boulder, CO (US)

(72) Inventors: Evan Salim, Lafayette, CO (US); Dana Zachary Anderson, Boulder, CO (US); Jayson Denney, Golden, CO (US); Farhad Majdeteimouri, Broomfield, CO (US)

(73) Assignee: ColdQuanta, Inc., Boulder, CO (US)

( * ) Notice: Subject to any disclaimer, the term of this patent is extended or adjusted under 35 U.S.C. 154(b) by 0 days.

(21) Appl. No.: 18/116,698

(22) Filed: Mar. 2, 2023

(65) Prior Publication Data

US 2024/0012039 A1    Jan. 11, 2024

Related U.S. Application Data

(60) Continuation of application No. 17/734,706, filed on May 2, 2022, now Pat. No. 11,630,143, which is a division of application No. 17/216,883, filed on Mar. 30, 2021, now Pat. No. 11,415,614, which is a continuation-in-part of application No. 16/576,067, filed on Sep. 19, 2019, now Pat. No. 11,002,777.

(60) Provisional application No. 62/795,743, filed on Jan. 23, 2019.

(51) Int. Cl.
*G01R 29/08*    (2006.01)
*G01R 33/60*    (2006.01)

(52) U.S. Cl.
CPC ......... *G01R 29/0885* (2013.01); *G01R 33/60* (2013.01)

(58) Field of Classification Search
CPC .............. G01R 15/242; G01R 29/0885; G01R 31/308; G01R 15/245; G01R 19/0092; G01R 11/36
USPC ......................................................... 324/97
See application file for complete search history.

(56) References Cited

U.S. PATENT DOCUMENTS

| 4,024,396 A | 5/1977 | Hill |
| 4,297,704 A | 10/1981 | Marom |
| 4,326,778 A | 4/1982 | Berg |

(Continued)

OTHER PUBLICATIONS

Ghosh, Megha, et al. "Demonstration of a high-contrast optical switching in an atomic delta system." Journal of Physics B: Atomic, Molecular and Optical Physics 50.16 (2017): 165502. (Year: 2017).*

(Continued)

*Primary Examiner* — Christopher P McAndrew
(74) *Attorney, Agent, or Firm* — Van Pelt, Yi & James LLP; Clifton Leon Anderson

(57) ABSTRACT

A microwave sensor determines an electric-field strength of a microwave field populated by quantum particles in an ultra-high vacuum (UHV) cell. A probe laser beam and a coupling laser beam are directed into the UHV cell so that they are generally orthogonal to each other and intersect to define a "Rydberg" intersection, so-called as the quantum particles within the Rydberg intersection transition to a pair of Rydberg states. The frequency of the probe laser beam is swept so that a frequency spectrum of the probe laser beam can be captured. The frequency spectrum is analyzed to determine a frequency difference between Autler-Townes peaks. The electric-field strength of the microwave field within the Rydberg intersection is then determined based on this frequency difference.

11 Claims, 12 Drawing Sheets

(56) References Cited

U.S. PATENT DOCUMENTS

| | | | |
|---|---|---|---|
| 4,766,439 | A | 8/1988 | Misek |
| 4,888,593 | A | 12/1989 | Friedman |
| 5,682,238 | A | 10/1997 | Levitt |
| 6,188,481 | B1 | 2/2001 | Kumar |
| 6,285,493 | B1 | 9/2001 | Carrott |
| 6,639,552 | B2 | 10/2003 | Carrott |
| 8,884,820 | B2 | 11/2014 | Poisel |
| 10,979,147 | B2 | 4/2021 | Gordon |
| 11,165,505 | B2 | 11/2021 | Gordon |
| 2003/0129117 | A1 | 7/2003 | Mills |
| 2015/0070217 | A1 | 3/2015 | Sharawi |
| 2016/0363617 | A1 | 12/2016 | Anderson |
| 2017/0370979 | A1 | 12/2017 | Braje |
| 2018/0031620 | A1 | 2/2018 | Anderson |
| 2018/0074600 | A1 | 3/2018 | Park |
| 2018/0373118 | A1* | 12/2018 | Kiffner ............... G02F 1/353 |
| 2019/0187198 | A1* | 6/2019 | Anderson .......... G01R 29/0878 |
| 2020/0136727 | A1 | 4/2020 | Graceffo |
| 2020/0233025 | A1 | 7/2020 | Salim |
| 2020/0292606 | A1 | 9/2020 | Holloway |
| 2021/0270882 | A1 | 9/2021 | Imhof |
| 2022/0196716 | A1 | 6/2022 | Anderson |

OTHER PUBLICATIONS

Joshi, Amitabh, and Min Xiao. "Controlling nonlinear optical processes in multi-level atomic systems." Progress in Optics 49 (2006): 97. (Year: 2006).*

Fan et al., "Effect of Vapor-Cell Geometry on Rydberg-Atom-Based Measurements of Radio-Frequency Electric Fields." American Physical Society, 2015., pp. 044015-1 through 044015-7 (2015).

Fan et al., "Atom Based RF Electric Field Sensing". 2015 J. Phys. B: At. Mol. Opt. Phys. 48 202001. pp. 1-17. (Year: 2015).

Holloway et al., "Atom-Based RF Electric Field Metrology: From Self-Calibrated Measurements to Subwavelength and Near-Field Imaging". IEEE Transactions on Electromagnetic Compatibility, vol. 59, No. 2, Apr. 2017. pp. 717-728. (Year: 2017).

Simons et al., "A Rydberg Atom-Based Mixer: Measuring the Phase of a Radio Frequency Wave". Applied Physics Letters 114, 114101 (2019). 5 pages. (Year: 2019).

Simons et al., "Embedding a Rydberg Atom-Based Sensor into an Antenna for Phase and Amplitude Detection of Radio-Frequency Fields and Modulated Signals", in IEEE Access, vol. 7, pp. 164975-164985, 2019, doi: 10.1109/ACCESS.2019.2949017. (Year: 2019).

Anderson et al., Rydberg atoms for radio-frequency communications and sensing: atomic receivers for pulsed RF field and phase detection, Rydberg Technologies Inc., Ann Arbor, MI 48103 USA; Oct. 18, 2019, 10 pages.

Berweger et al., Rydberg state engineering: A comparison of tuning schemes for continuous frequency sensing, Sep. 28, 2022; 11 pages.

Berweger et al., Rydberg-State Engineering: Investigations of Tuning Schemes for Continuous Frequency Sensing, Physical Review Applied 19, 044049, 13 pages, Apr. 18, 2023.

Bohaichuk et al., The Origins of Rydberg Atom Electrometer Transient Response and its Impact on Radio Frequency Pulse Sensing, Quantum Valley Ideas Laboratories, Sep. 13, 2022, 20 pages.

Cai et al., Sensitivity improvement of Rydberg atom-based microwave sensing via electromagnetically induced transparency, Nov. 15, 2021, 8 pages.

Carr et al., Three-photon electromagnetically induced transparency using Rydberg states, Optics Letters / vol. 37, No. 18, Sep. 15, 2012, 3 pages.

Carter et al., Electric field sensing near the surface microstructure of an atom chip using cold Rydberg atoms, Department of Physics and Astronomy and Institute for Quantum Computing, University of Waterloo, Dec. 21, 2013, 7 pages.

Daschner et al., Triple stack glass-to-glass anodic bonding for optogalvanic spectroscopy cells with electrical feedthroughs, Physikalisches Institut, Mar. 5, 2014, 4 pages.

David Henry Meyer, Magnetic & Electric Field Sensing and Applications Based on Coherent Effects in Neutral Atoms, 2018, 265 pages.

Fan et al., Atom Based RF Electric Field Sensing, Journal of Physics B: Atomic, Molecular and Optical Physics, Topical Review, published Sep. 9, 2015, pp. 1-16.

Fan et al., Sub-wavelength microwave electric field imaging using Rydberg atoms inside atomic vapor cells, Homer L. Dodge Department of Physics and Astronomy, the University of Oklahoma, Mar. 14, 2014, 5 pages.

Grabowski et al., High Resolution Rydberg Spectroscopy of ultracold Rubidium Atoms, Aug. 25, 2016, 9 pages.

Holloway et al., Broadband Rydberg Atom Based Self-Calibrating RF E-Field Probe, National Institute of Standards and Technology (NIST), Electromagnetics Division, 3 pages.

Holloway et al., Broadband Rydberg Atom-Based Electric-Field Probe: From Self-Calibrated Measurements to Sub-Wavelength Imaging, National Institute of Standards and Technology (NIST), U.S. Department of Commerce, Boulder Laboratories, May 27, 2014, 12 pages.

Holloway et al., Electric field metrology for SI traceability: Systematic measurement uncertainties in electromagnetically induced transparency in atomic vapor, Journal of Applied Physics 121, 233106; doi: 10.1063/1.4984201, 2017, 10 pages.

Holloway et al., Electromagnetically induced transparency based Rydberg-atom sensor for quantum voltage measurements, Oct. 26, 2021, 13 pages.

Hu et al., Continuously tunable radio frequency electrometry with Rydberg atoms, Appl. Phys. Lett. 121, 014002; https://doi.org/10.1063/5.0086357, Jul. 7, 2022, 7 pages.

Kilian Talo Theodor Singer, Interactions in an ultracold gas of Rydberg atoms, Oct. 2004, 133 pages.

Mao et al., A high-efficiency fiber-coupled Rydberg-atom integrated probe and its imaging applications, IEEE Antennas and Wireless Propagation Letters, 2022, 5 pages.

Meyer et al., Optimal Atomic Quantum Sensing using EIT Readout, Aug. 9, 2021, 12 pages.

Otto et al., Data capacity scaling of a distributed Rydberg atomic receiver array, Department of Physics, QSO-Centre for Quantum Science, and Dodd-Walls Centre, University of Otago, Dunedin, New Zealand, Apr. 8, 2021, 10 pages.

Prajapati et al., Enhancement of electromagnetically induced transparency based Rydberg-atom electrometry through population repumping, Aug. 31, 2021, 5 pages.

Prajapati et al., TV and Video Game Streaming with a Quantum Receiver: A Study on a Rydberg atom-based receiver's bandwidth and reception clarity, National Institute of Standards and Technology, May 13, 2022, 6 pages.

Renate Daschner, Addressable Rubidium vapor cells for optical and electrical read-out of Rydberg excitations, 2015, 195 pages.

Ripka et al., Rydberg atom-based radio frequency: hyperfine effects, Proc. SPIE 12016, Optical and Quantum Sensing and Precision Metrology II, 1201601, Mar. 2, 2022, 7 pages.

Simons et al., Continuous radio frequency electric-field detection through adjacent Rydberg resonance tuning, Oct. 9, 2021, 9 pages.

Simons et al., Using frequency detuning to improve the sensitivity of electric field measurements via electromagnetically induced transparency and Autler-Townes splitting in Rydberg atoms, Applied Physics Letters 108, 174101; doi: 10.1063/1.4947231, 2016, 6 pages.

Teale et al., Degenerate two-photon Rydberg atom voltage reference, AVS Quantum Sci. 4, 024403; https://doi.org/10.1116/5.0090892, Jun. 15, 2022, 6 pages.

Thaicharoen et al., Electromagnetically-induced transparency, absorption, and microwave field sensing in a Rb vapor cell with a three-color all-infrared laser system, May 27, 2019, 9 pages.

Van Ditzhuijzen et al., Simultaneous position and state measurement of Rydberg atoms, Eur. Phys. J. D 40, 13-17. DOI: 10.1140/epjd/e2006-00140-1, Jun. 21, 2006, 6 pages.

You et al., Microwave-field sensing via electromagnetically induced absorption of Rb irradiated by three-color infrared lasers, vol. 30, No. 10, Optics Express, May 9, 2022, 11 pages.

(56) References Cited

OTHER PUBLICATIONS

Jason Owen Day. Progress Towards the Creation of an On-Demand Single Photon Source Using Rydberg Atoms. Diss. University of Wisconsin-Madison, 2008. (Year: 2008).

Lauren Levac. Observation of the Dipole-dipole Interaction in Dressed State Rydberg Atoms by Microwave Spectroscopy. Diss. University of Virginia, 2013. (Year: 2013).

Robinson et al. "Determining the angle-of-arrival of a radio-frequency source with a Rydberg atom-based sensor." Appl. Phys. Lett. Mar. 15, 2021; 118 (11): 114001. (Year: 2021).

Simons et al. "Applications with a Rydberg Atom-Based Radio Frequency Antenna/Receiver." Proc. of the 2019 International Symposium on Electromagnetic Compatibility (EMC Europe 2019). Sep. 2-6, 2019. pp. 885-889. (Year: 2019).

Barber et al., Angle of arrival estimation using spectral interferometry, Journal of Luminescence, vol. 130, No. 9, Sep. 1, 2010, pp. 1614-1618.

Kumar et al., Rydberg-Atom based Radio-Frequency Electrometry using Frequency Modulation Spectroscopy in room Temperature Vapor Cells, Feb. 3, 2017.

\* cited by examiner

MICROWAVE SENSOR USING AUTLER-TOWNES SPLITTING

CROSS REFERENCE TO OTHER APPLICATIONS

This application is a continuation of U.S. patent application Ser. No. 17/734,706 entitled MICROWAVE SENSOR USING AUTLER-TOWNES SPLITTING filed May 2, 2022, which is a divisional of U.S. patent application Ser. No. 17/216,883, now U.S. Pat. No. 11,415,614, entitled RYDBERG-PARTICLE-BASED 3D MICROWAVE SENSOR, which is a continuation in part of U.S. patent application Ser. No. 16/576,067, now U.S. Pat. No. 11,002,777, entitled MICROWAVE SENSOR USING RYDBERG PARTICLES, filed Sep. 19, 2019, which claims priority to U.S. Provisional Patent Application No. 62/795,743 entitled RYDBERG-ATOM RF SENSORS FOR DIRECTION FINDING AND GEOLOCATION filed Jan. 23, 2019, all of which are incorporated herein by reference for all purposes.

This invention was made with government support under grant number FA8650-19-C-1736 awarded by the U.S. Air Force. The government has certain rights in the invention.

BACKGROUND

Microwaves have many applications including those in point-to-point communication links, satellite and spacecraft communication, remote sensing, radio astronomy, radar, and medical imaging. "Microwave", as broadly defined herein, encompasses electromagnetic radiation of wavelengths of one meter (corresponding to a frequency of 300 megahertz (MHz)) down to 100 micrometers (corresponding to a frequency of three terahertz (THz)); in other words, "microwave", as defined herein, encompasses ultra-high frequency (UHF), super high frequency (SHF), extremely high frequency (EHF), also known as "millimeter wave", and tremendously high frequency (THF) frequency ranges defined by the International Telecommunications Union (ITU).

In many microwave applications, it can be important to determine the propagation direction and electric-field strength of a received microwave vector. Herein, "microwave vector" refers to a propagating microwave field or field component that can be characterized by a combination of 1) a propagation direction that corresponds to the orientation of the vector; and 2) an electric-field strength that corresponds to the magnitude of the vector. If the vector is information-bearing, then it qualifies as a microwave "signal". For example, characterizing the direction and strength of an information-bearing microwave signal can be used to locate its transmitter, e.g., to orient a receiver's antenna or for geolocation purposes.

While microwave sensors have been realized using a variety of technologies, performance has been limited by a lack of sensitivity. What is needed is an approach to microwave sensing that provides for greater sensitivity in direction and intensity measurements.

DETAILED DESCRIPTION

In accordance with the present invention, a microwave sensor measures the electric-field strength of a microwave field based on a frequency differential between Autler-Townes peaks, that, is transmission peaks resulting from Autler-Townes splitting. A probe laser beam and a coupling laser beam intersect with a microwave field populated by quantum particles, e.g., alkali atoms. The frequency of the probe laser beam is swept and captured to provide a probe laser beam frequency spectrum from which the frequency differential can be determined. The electric-field strength of the microwave field at the Rydberg intersection can then be determined from the frequency differential.

The probe laser beam and the coupling laser beam intersect within a particle cloud excite quantum particles (i.e., neutral or charged atoms or molecules) into a superposition of a ground state and a Rydberg state. Herein, the volume within which the laser beams intersect is referred to as a "Rydberg intersection" to emphasize its characteristic contents. Effectively, the Rydberg intersection defines the location of a microwave detector having high sensitivity and low noise. The probe and coupling beams can be steered so as to move the Rydberg intersection within the particle cloud to obtain an electric-field strength distribution for the microwave field.

Figure 1:
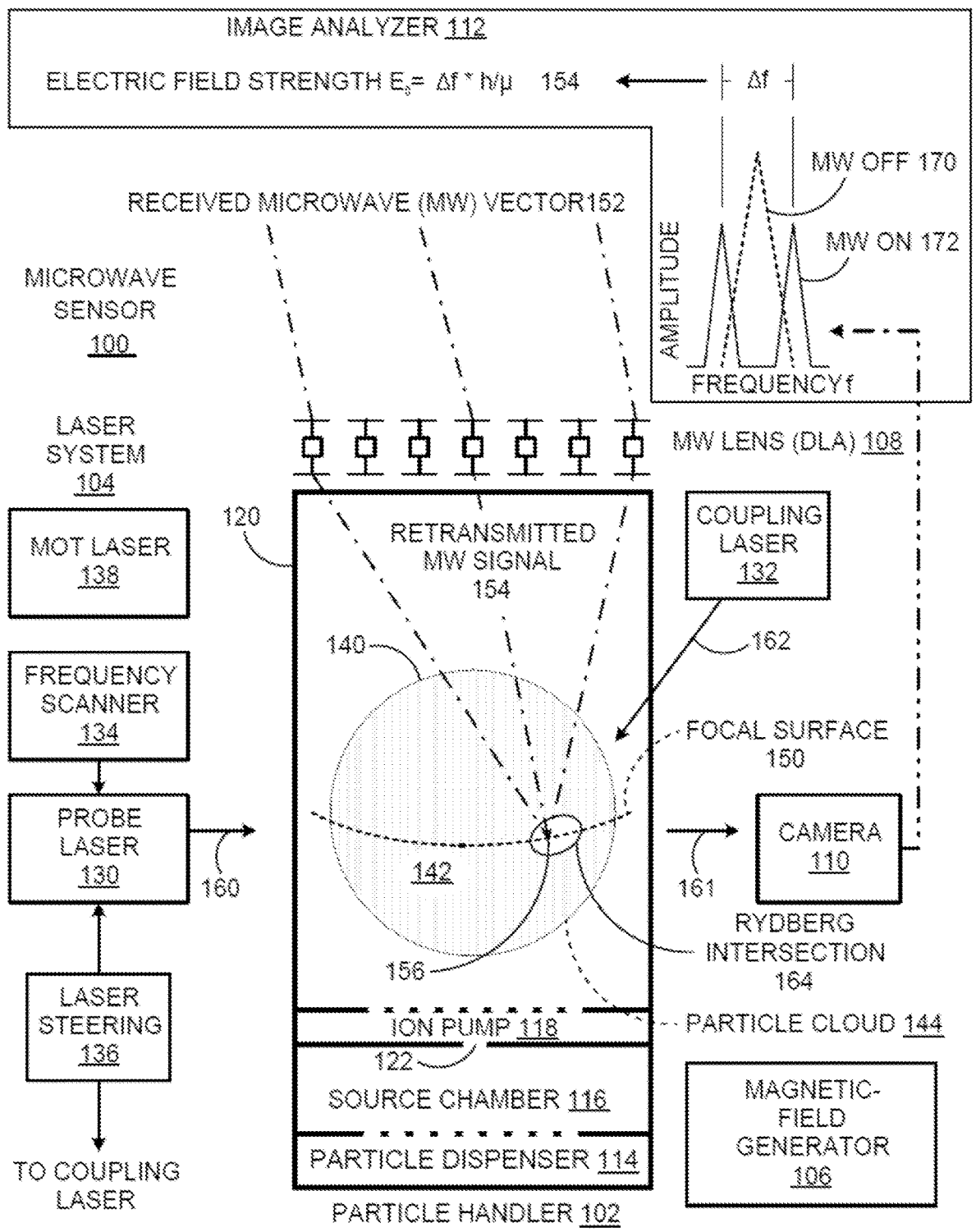
FIG. 1 is a schematic illustration of a microwave sensor using Rydberg particles to achieve high sensitivity characterization of microwave vectors.

As shown in FIG. 1, a microwave sensor 100 includes a particle handler 102, a laser system 104, a magnetic-field generator 106, a microwave lens 108, a camera 110, and an image analyzer 112. Camera 110 and image analyzer 112 function together as a spectrum analyzer.

Figure 2:
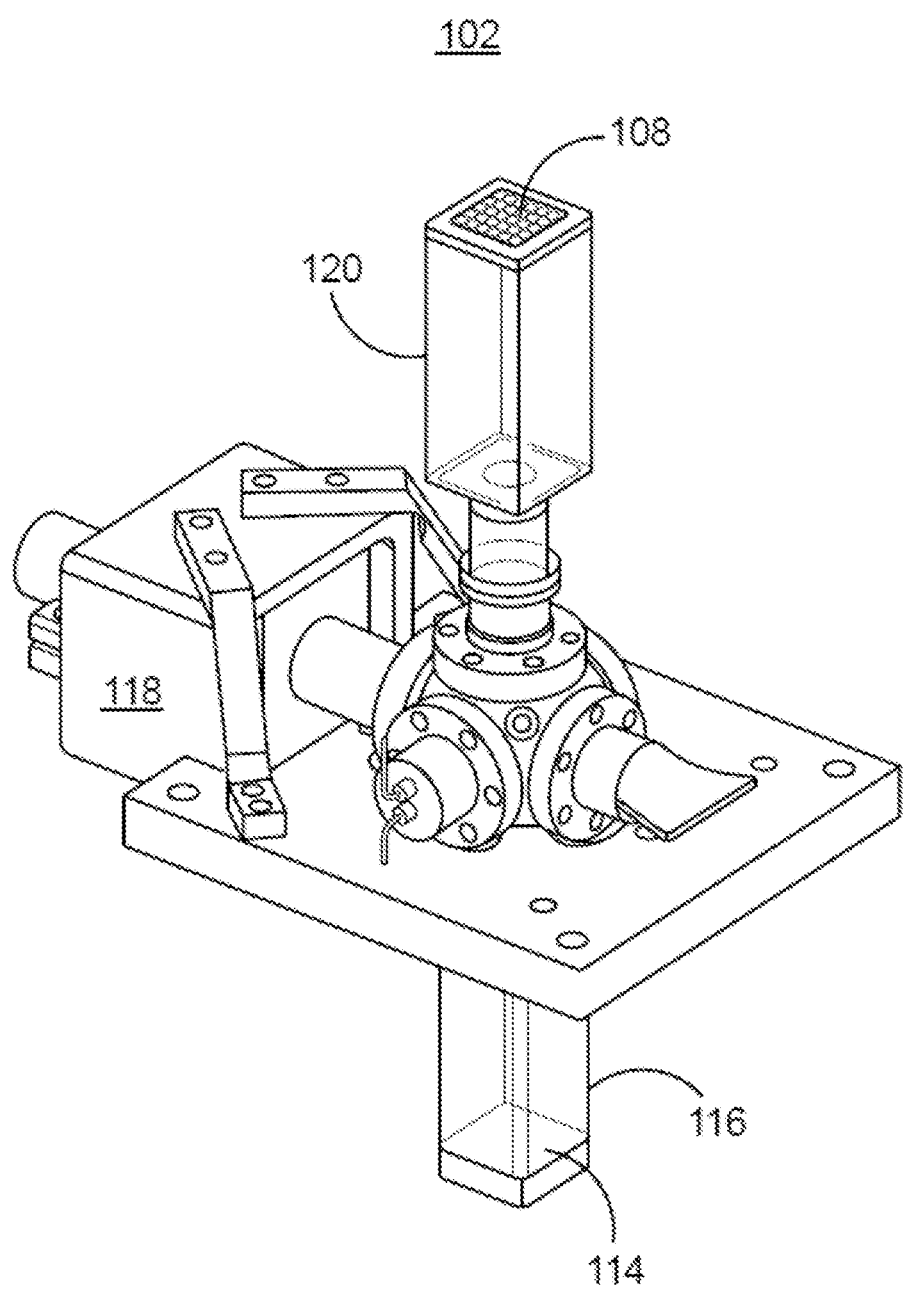
FIG. 2 is a perspective view of a particle handler of the sensor of FIG. 1.

Particle handler 102 includes a particle dispenser 114 in a source chamber 116, a manifold including an ion pump 118 and a particle cloud chamber 120. Particle cloud chamber 120 is an ultra-high vacuum (UHV) cell serving to isolate a particle cloud from the environment. Microwave lens 108 is located at the top or front end of particle handler 102 and adjacent to particle-cloud chamber 120. Laser system 104 includes a probe laser 130, one or more coupling lasers 132, a frequency scanner 134, a laser steering module 136, and a magneto-optical trap (MOT) laser 138. Particle handler 102, shown in perspective in FIG. 2, can be based on a RuBECi® system available from ColdQuanta Inc.

Particles are released from particle dispenser 114, expanding into source chamber 116. In the illustrated embodiment, the particles are rubidium 87 atoms ($^{87}$Rb). Alternatively, the particles can be cesium 133 ($^{133}$Cs) atoms, other isotopes of rubidium or cesium, other alkali atoms, non-alkali atoms, ions, or neutral or charged molecules. Particles exit source chamber 116 through a pinhole 122 into the manifold including ion pump 118. Ion pump 118 helps maintain an ultra-high vacuum (UHV) in particle cloud chamber 120, while pinhole 122 supports a pressure differential relative to a weaker vacuum for source chamber 116. Magnetic-field generator 106 and MOT laser 138 establish a magneto-optical trap 140 that confines particles in chamber 120 so that they form a cloud 142. MOT 140 can be a two-dimensional (2D) MOT, a six-beam 2D MOT, a three-dimensional MOT (3D MOT), or any one of a variety of suitable MOTs or optical traps. A MOT can trap cold particles to achieve a dense population so that high spatial resolution can be attained.

Microwave lens 108 is designed to focus incoming microwave vectors (with planar wavefronts) onto a focal surface 150 within particle-cloud chamber 120. As shown in FIG. 1, focal surface 150 extends through particle cloud 142. For example, a "received" far-field microwave vector 152 can arrive at microwave lens 108. Microwave lens 108 can retransmit the received microwave vector 152 to yield retransmitted microwave vector 154 in cloud chamber 120 that is focused on a spot 156 on focal surface 150. An electric-field strength of the incoming microwave vector can be determined from the intensity of the focused "image" of that vector at focal surface 150. In alternative embodiments, the microwave lens manipulates the incident radiation in other ways.

Figure 3:
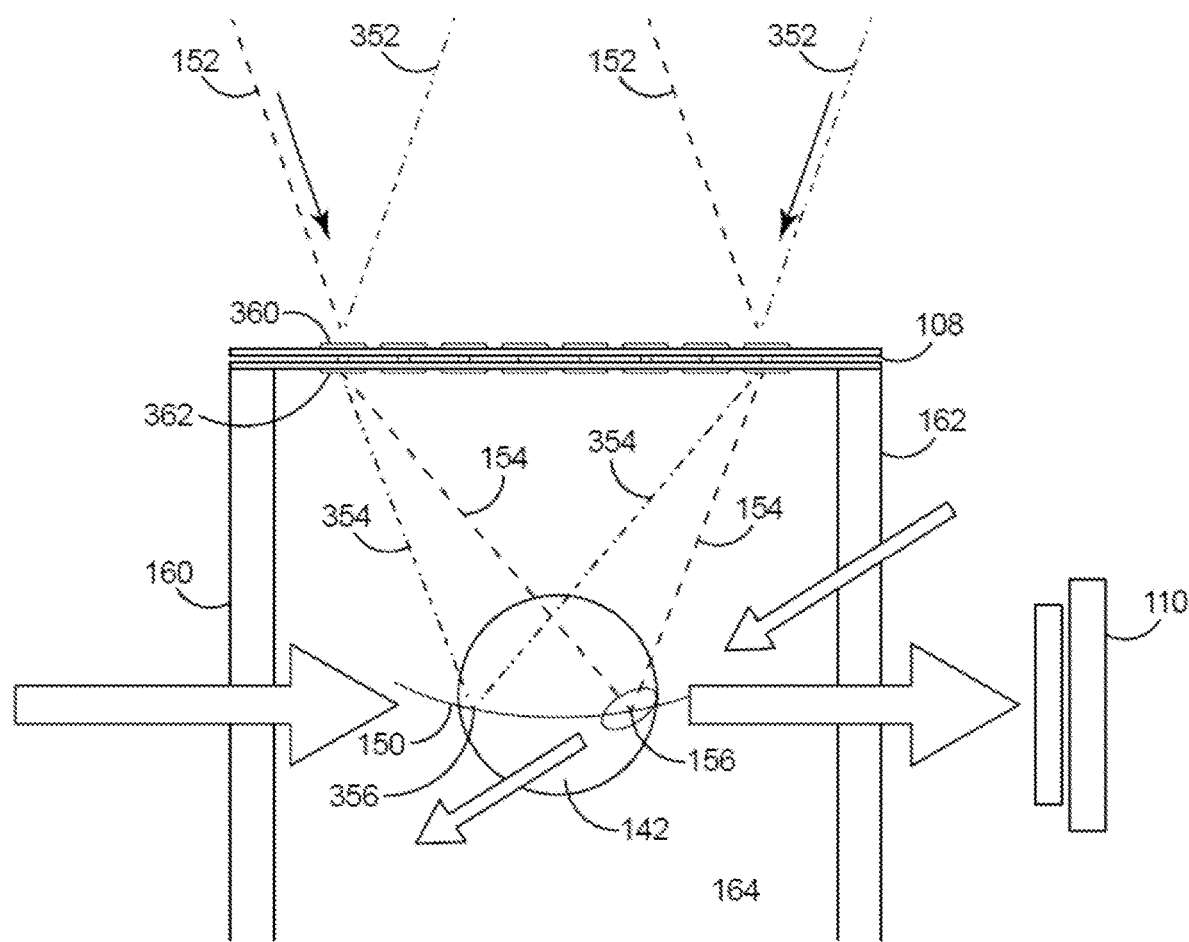
FIG. 3 is a schematic diagram showing how the sensor of FIG. 1 characterizes microwave vectors.

The coupling of the atom-lens system allows for information contained in the microwave vector to be converted to a measurable signal on the atoms; for example, the lens can be used to convert phase information from the vector into spatial information in the cloud, etc. In the case of the illustrated simple lens, the location of spot 156 is determined by the angle of incidence of the received microwave vector 152. Accordingly, the direction of the received microwave vector can be determined as a function of the location of the focal spot 156 on focal surface 150. As shown in FIG. 3, second microwave vector 352 having a different direction than microwave vector 152 results in a transmitted microwave vector 354 with a focal spot 356 at a different location of focal surface 150. In effect, microwave lens 108 applies a Fourier transform to incoming far-field microwave vectors; reversing the Fourier transform allows the direction of the received microwave vectors to be characterized from the locations of the respective focal spots on focal surface 150.

Figure 4A:
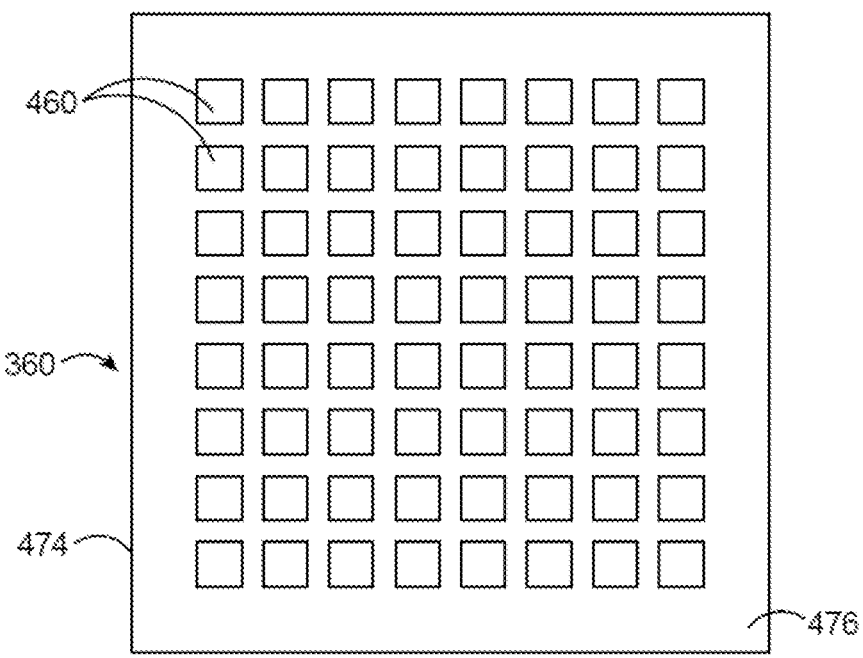
FIG. 4A is a top schematic plan view of a front-side lenslet array of a discrete lenslet array (DLA) that serves as a microwave lens in the sensor of FIG. 1.

In the illustrated embodiment, microwave lens 108 is designed for a microwave or, more specifically, a millimeter-wave, frequency of 104.7 gigahertz (GHz). Microwave lens 108 is implemented as a discrete lenslet array (DLA) including a front-side (receiving) antenna array 360 and a backside (transmitting) antenna array 362. Front-side antenna array 360 samples the incident W-band field at a Nyquist spatial frequency ($\lambda/2$, where $\lambda$ is the free-space wavelength). As shown in FIG. 4A, front-side array 360 is an 18 mm 8×8 square array of 64 antenna elements 460. As shown in FIG. 4B, back-side array 362 is a matching 18 mm square 8×8 array of 64 antenna elements 462. In alternative embodiments, different array dimensions are used, e.g., 10×10. Also, some alternative embodiments use physical optics instead of or in addition to DLAs.

Figure 4C:
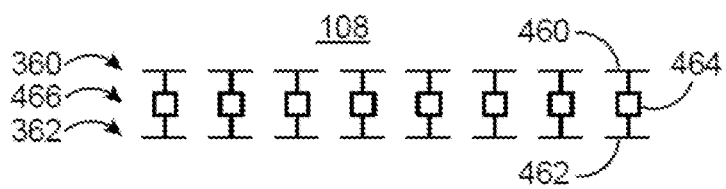
FIG. 4C is a schematic elevational view of the DLA showing delay elements that couple lenslets of the front-side array with respective lenslets of the back-side array.
Figure 4B:
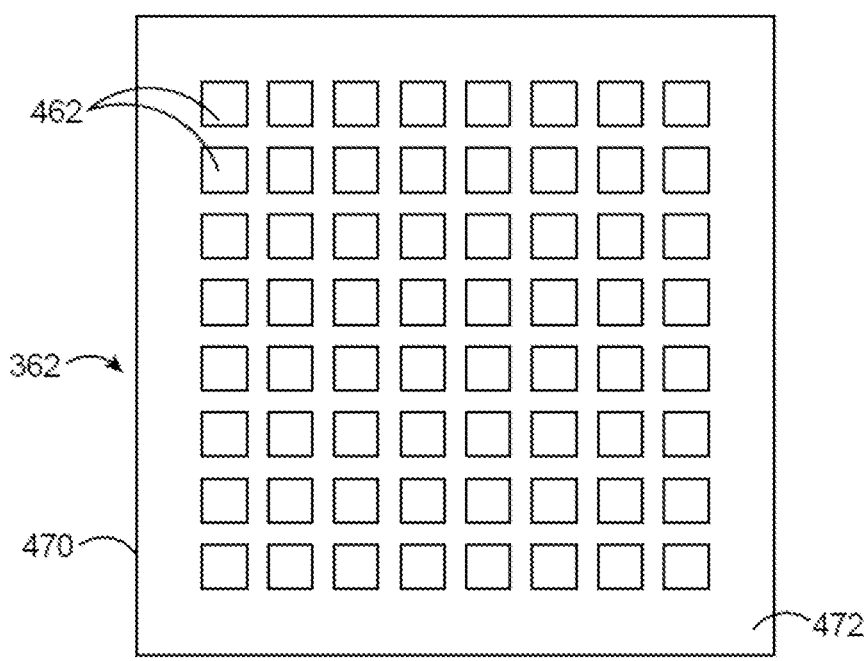
FIG. 4B is a bottom schematic plan view of a back-side lenslet array of the DLA.

As indicated in FIG. 4C, each antenna element 460 of front-side array 360 is coupled to a respective antenna element 462 of back-side array 362 via a respective delay circuit 464 of an array of delay circuits 466. The amount of delay imposed by delay circuits 464 varies spatially in that relatively central delay circuits impose a greater delay than relatively peripheral delay circuits.

In other embodiments, the antenna elements of the two arrays are distributed irregularly within their respective array to minimize image artifacts. Furthermore, the antenna elements of one array are not aligned with those of the other array. The number of antenna elements for one array can equal the number of the other array, respective pairs of antenna elements can be coupled respectively through a like number of delay elements.

The focal length for microwave lens 108 is 15 mm, with an acceptable variance of ±3 mm. This focal length is suited for a frequency range of 90 GHz to 110 GHz, which includes the target frequency of 104.7 GHz. DLA 108 creates a flat focusing surface, which allows for a simpler imaging system (i.e. using one CCD camera versus using two CCD cameras) to extract the complete vector information of the incoming microwave field. In alternative embodiments, other focal lengths are used, e.g., to correspond to different frequencies, working distances, and apertures.

Microwave lens 108 implements a discrete Fourier transform (DFT) so as to focus planar wavefronts to respective spots in the focal curve; this is useful for far-field applications such as radar and communications. For near-field applications such as brain imaging and biological sensing, the microwave lens focuses diverging wavefronts to respective spots on the focal surface; for these near-field applications, transfer functions other than Fourier transforms can be used. Typically, multiple simultaneous incident waves form a non-uniform power density distribution on the focal surface.

Backside antenna array 362 (FIG. 4B) is formed on a substrate 470 of high-resistivity silicon so as to leave a 2.0 mm border 472, which is to be anodically bonded to cloud particle cell 122. Cell 122 has outer dimensions of 23 mm×23 mm×61 mm, and an internal cross section of 20 mm×20 mm. In other embodiments, different specifications apply.

The design parameters of the DLA (focal length and shape of the focusing surface) are selected to match the position of the focal spot with the size and the position of the cloud of Rydberg atoms inside the vacuum cell. The design is diffraction limited to operate the DLA at a target frequency of 104.7 GHz, which corresponds to the transition between Rydberg states $28D_{5/2}$ and $29P_{3/2}$ in rubidium. So as to match back-side antenna array 362, front-side antenna array 360 (FIG. 4A) is formed on a substrate 474 so as to leave a 2.0 mm border 476.

The field strength of microwave vector 154 (FIG. 1) can be determined from its impact on the transmission spectrum of a probe laser beam 160 from probe laser 122. With reference to the energy-level diagram of FIG. 5, in the absence of a coupling beam and a microwave signal, a 780 nanometer (nm) probe beam is absorbed by $^{87}Rb$ atoms at the target microwave frequency of $\Omega_{RF}$=104.7 GHz. Electrons in a ground state $5S_{1/2}$ transition to a $5P_{3/2}$ (non-Rydberg) excited state.

A coupling laser beam 162 (FIG. 1) from coupling laser 132 can be directed to intersect probe laser beam 160 so that Rydberg atoms are generated in Rydberg intersection 164, which includes the focal spot of the retransmitted microwave vector. Rydberg intersection 164 can have a compact shape: 1) large enough so that a strong spectral signal can be obtained; and 2) small enough to resolve the microwave vector of interest from microwave vectors coming from slightly different directions. To achieve a compact intersection shape, the probe and coupling beams can be orthogonal or nearly (e.g., ±10°) orthogonal. In alternative embodiments, plural coupling beams are used; also, in some embodiments, the probe and coupling beams are not orthogonal.

For the illustrated case of 104.7 GHz detection, a 482 nm coupling beam can cause the atoms in the $5P_{3/2}$ state (FIG. 5) to jump to the $28D_{5/2}$ Rydberg state. Thus, the particles are in a superposition of the $5S_{1/2}$ ground state and the $28D_{5/2}$ Rydberg state. From the perspective of the probe beam, this is a "dark" superposition as particles in neither state can absorb light of the probe wavelength (in this case, 780 nm). In a phenomenon known as electromagnetically induced transparency (EIT), the coupling beam replaces with or superimposes upon the former absorption peak a transmission peak 170 (FIG. 6) at the probe laser wavelength. Transmission peak 170 can be captured by using frequency scanner 134 (FIG. 1) to modulate the frequency of probe laser beam 160 across its center frequency; the result can be recorded using camera 110.

The effect of a microwave vector on the Rydberg atoms in intersection 164 (FIG. 1) is to couple the $28D_{5/2}$ Rydberg state (FIG. 5) to another Rydberg state $29P_{3/2}$. This coupling upsets the balance of the superposition state, and the atoms are no longer in a dark state with respect to the probe laser. The effect on the spectrum probe transmission through the intersection is to split the transmission peak 170 into a pair of transmission peaks 172, as indicated in FIG. 6. The frequency difference ($\Delta f$) between the peaks 172 corresponds to the electric field strength $E_0$ of the received microwave vector according to formula 154 ($E_0 = \Delta f * h / \mu$ (FIG. 1), where h is Plank's constant and $\mu$ is the dipole moment of the Rydberg atoms. Since h is a universal constant and $\mu$ is a constant for a given Rydberg state, $h/\mu$ is a constant and the field strength of microwave vector 152 is proportional to $\Delta f$.

Figure 5:
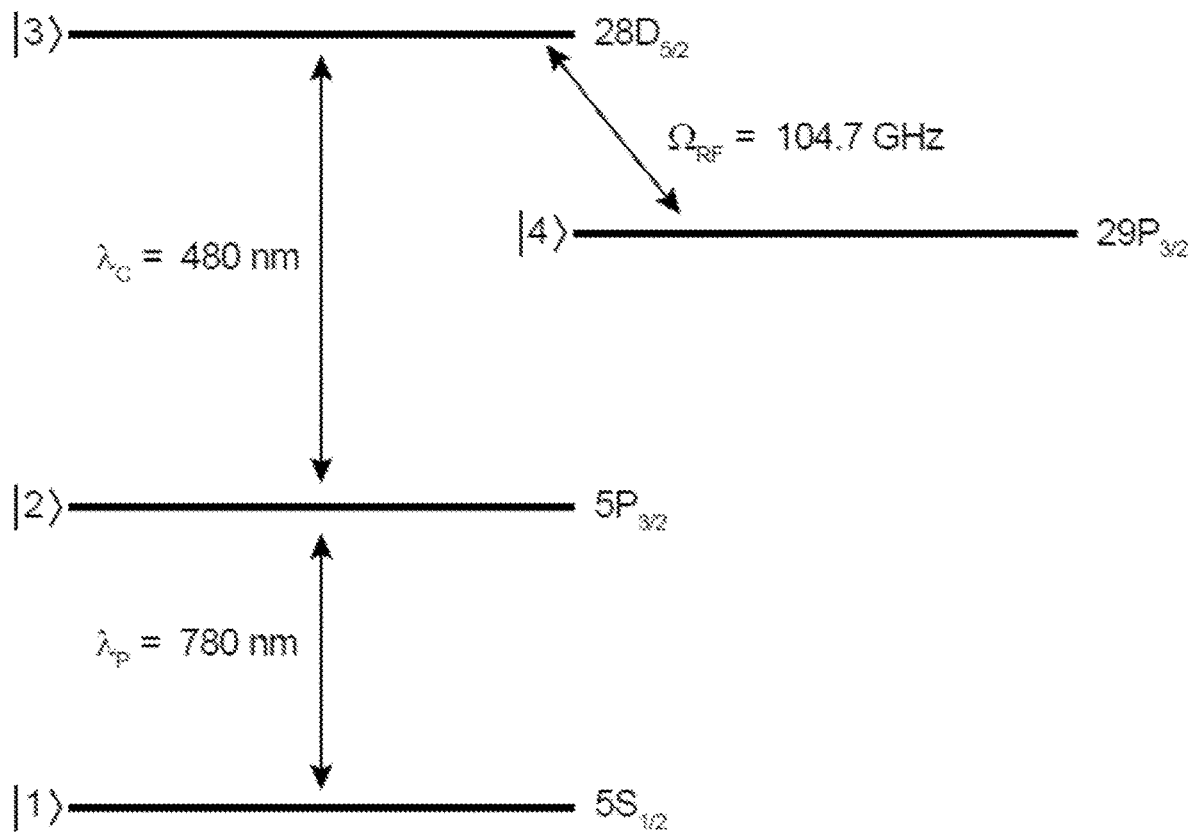
FIG. 5 is an energy diagram showing different states of a particle, in this case, a rubidium 87 atom, used by the sensor of FIG. 1 to evaluate the intensity of microwave vectors.
Figure 6:
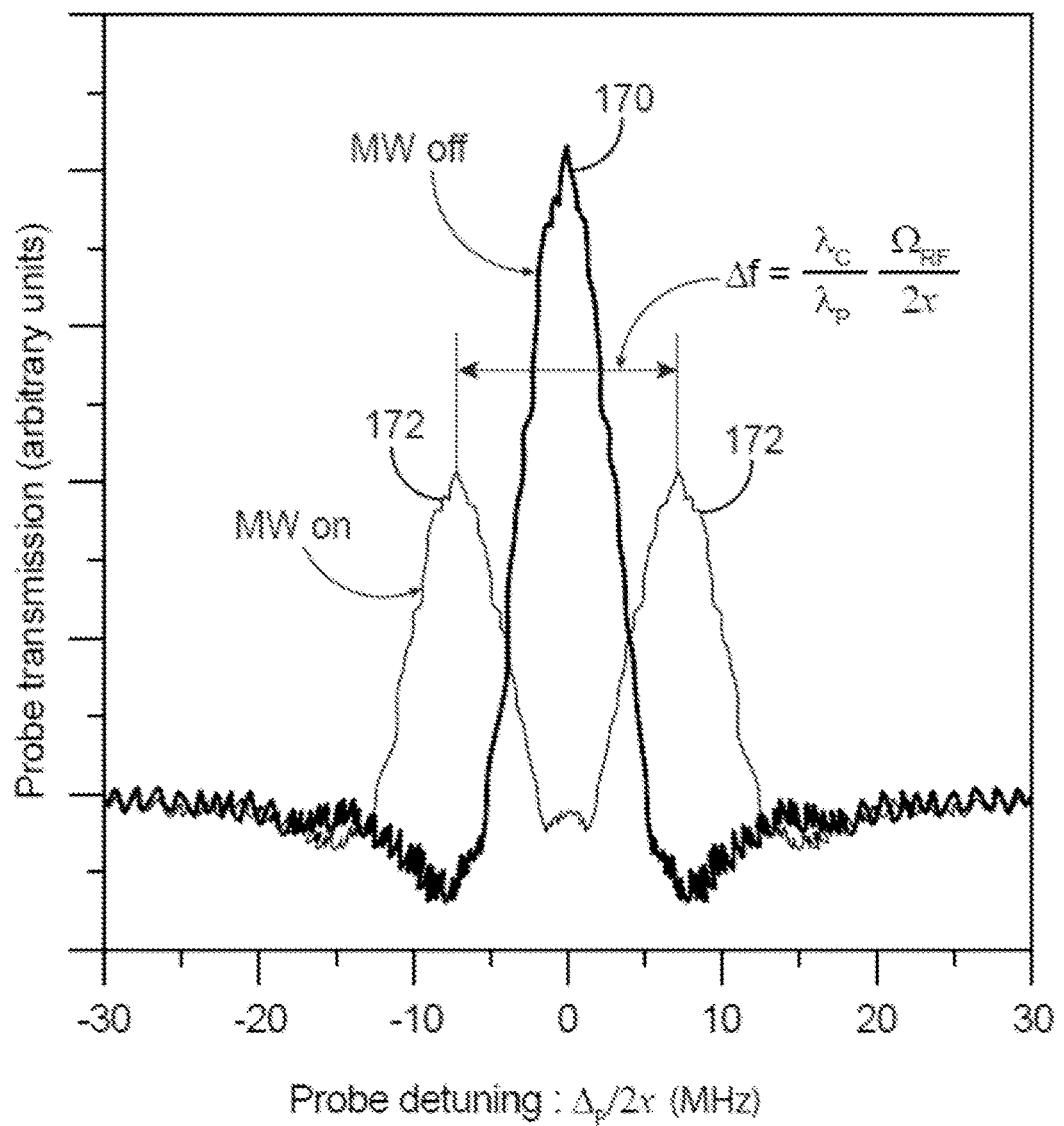
FIG. 6 is a graph comparing spectra of a probe laser beams showing laser-beam intensity as a function of frequency detuning both in the absence of a microwave field and in the presence of a microwave field.

Detection of microwave vectors with Rydberg atoms is implemented as shown in FIG. 5. Probe and coupling laser beams are sent through a vapor cell to couple states |1⟩→|2⟩→|3⟩ (states $5S_{1/2}$, $5P_{3/2}$, $28D_{5/2}$, respectively, in FIG. 5) to produce Rydberg atoms and see the EIT signal (center peak 170 in FIG. 6). In the presence of a microwave field, which couples the Rydberg state |3⟩ to a second Rydberg state |4⟩, the EIT peak 170 splits, yielding Autler-Townes (AT) peaks 172.

Figure 7A:
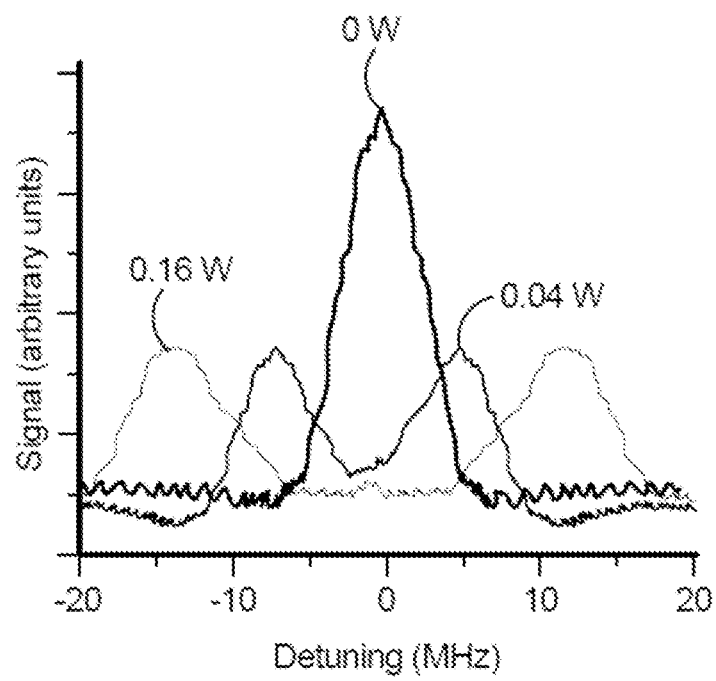
FIG. 7A is a graph comparing three transmission spectra for different microwave vector intensities, illustrating how microwave intensity can be determined from a frequency spectrum.
Figure 7B:
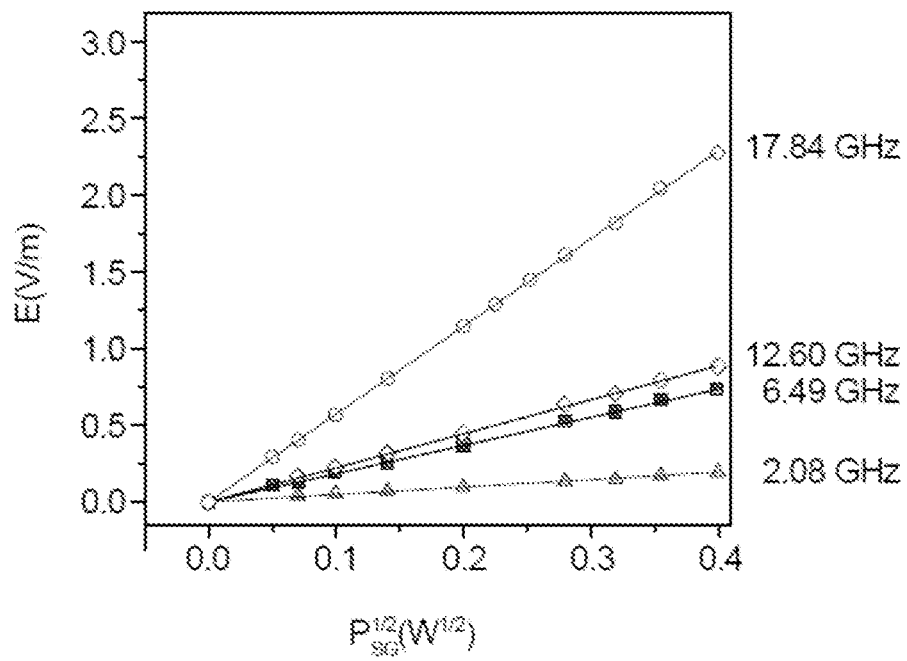
FIG. 7B is a graph showing, for four different frequencies, linear relations between microwave field strength and Autler-Townes frequency differences.

FIG. 7A presents experimental data showing that the frequency differences due to Autler-Townes splitting for 2.08 GHz is greater for higher microwave power. The data in FIG. 7B demonstrates the excellent linearity between the Autler-Townes splitting and the amplitude of the incident electric field. For each measured frequency (2.08 GHz, 6.49 GHz, 12.60 GHz, and 17.84 GHz), a different pair of Rydberg levels is used, and the coupling laser wavelength is slightly changed (typically, by less than 1 nm) to access the Rydberg levels from the intermediate $5P_{3/2}$ state. In general, lower microwave frequencies correspond to large dipole moments (and therefore greater measurement sensitivity).

The background atoms (outside Rydberg intersection 164) traversed by probe laser beam 160 (FIG. 1) are sparse since they are loaded from a secondary MOT, (i.e. the background pressure of Rb in the second chamber should be $10^{10}$); therefore, they do not contribute much to the signal captured by camera 110. In a variation, the atoms are compressed to maximally overlap with the Rydberg intersection to improve the signal-to-noise ratio in images captured by camera 110. Another variation uses Doppler-free spectroscopy (counter-propagating laser beams) such that only atoms that have no velocity component in the direction of the laser beams contribute to the signal.

Thus, the microwave electric field strength within the Rydberg intersection can be determined from the probe beam spectrum, while the microwave propagation vector direction can be determined from the location of the intersection of the probe and coupling beams. To determine the field strengths of microwave vectors from other directions, Rydberg intersection 164 can be moved by translating probe laser 130 and coupling laser 132 using laser steering function 136.

To obtain a two-dimensional map of field strength, i.e., determine a power distribution, as a function of direction, laser steering function 136 can scan (rasterize) the lasers and thus the Rydberg intersection across the focal surface. Readout of the microwave field distribution is thus accomplished by performing a readout of the optical probe. By measuring its spatial distribution, inferring from it the microwave field distribution at the focal surface and applying the inverse (e.g., Fourier) transform, the incident directions of the incoming microwaves can be determined. As mentioned above, the focusing properties of the lens can be designed for either far-field or near-field sources.

While Rydberg electrometry only works for frequencies that match one of the available Rydberg transitions, the spectrum of Rydberg transitions is so dense it is almost always possible to find a transition species and isotope for a desired frequency. In some cases using $^{87}Rb$, the transition from the 28D5/2 can be to a Rydberg state other than the $29P_{3/2}$ Rydberg state. In other cases, the first Rydberg state is other than $28D_{5/2}$. The table below presents a few examples for frequencies for which experimental data is available.

| Microwave Frequency [GHz] | Microwave wavelength [mm] | Rydberg States Coupled | Complete list of states coupled during state preparation and detection. $\|1\rangle \to \|2\rangle \to \|3\rangle \to \|4\rangle$ |
|---|---|---|---|
| 17.04 | 17.59 | $50D_{5/2} - 51P_{3/2}$ | $5S_{1/2} - 5P_{3/2} - 50D_{5/2} - 51P_{3/2}$ |
| 93.71 | 3.22 | $29D_{5/2} - 30P_{3/2}$ | $5S_{1/2} - 5P_{3/2} - 29D_{5/2} - 30P_{3/2}$ |
| 104.77 | 2.88 | $28D_{5/2} - 29P_{3/2}$ | $5S_{1/2} - 5P_{3/2} - 28D_{5/2} - 29P_{3/2}$ |
| 309.30 | 0.97 | $20D_{5/2} - 21P_{3/2}$ | $5S_{1/2} - 5P_{3/2} - 20D_{5/2} - 21P_{3/2}$ |

Figure 8:
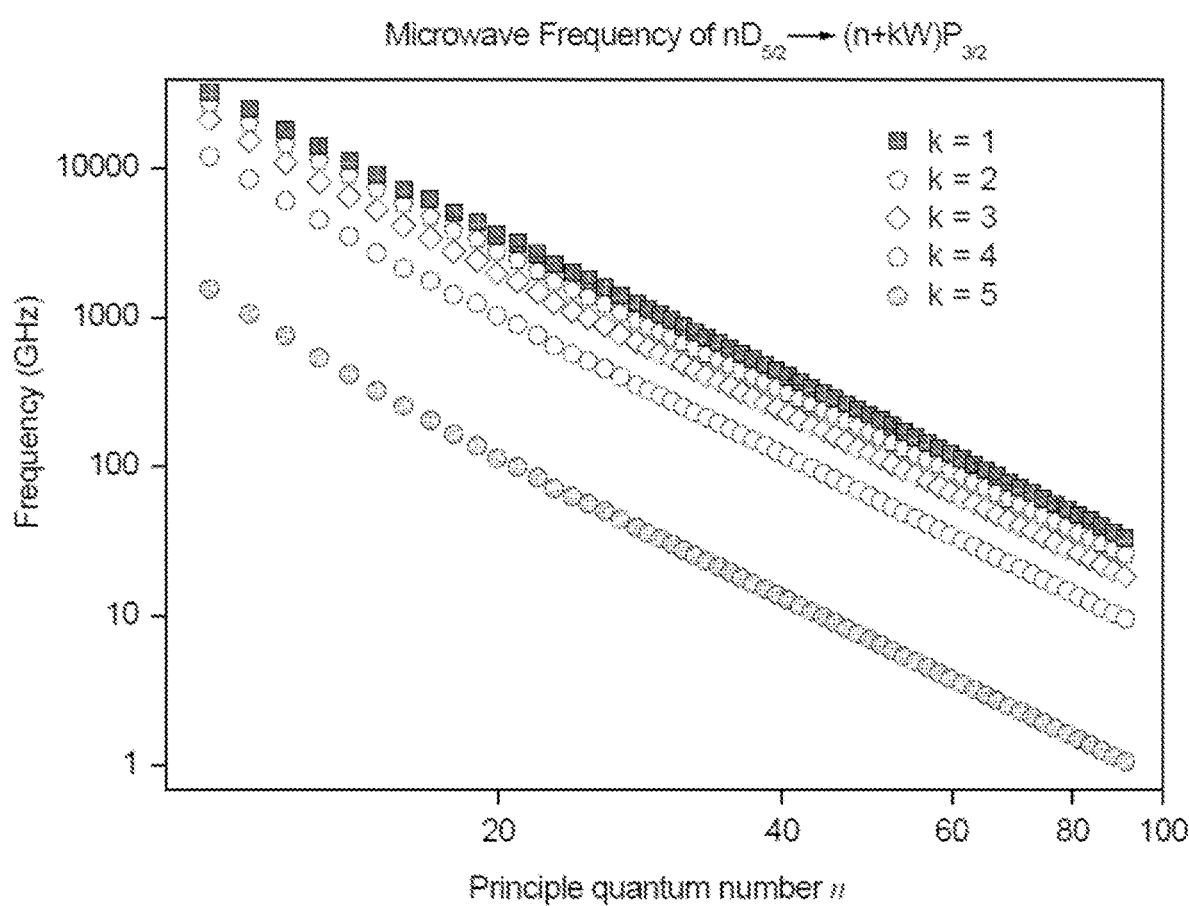
FIG. 8 is a graph showing that, for most microwave frequencies, there is a corresponding pair of Rydberg states of Cesium 133 atoms that can be used for determining microwave field strength.

In other cases, a different particle species may be required, e.g., cesium ($^{133}$Cs) atoms may be used instead of rubidium atoms. For example, the graph of FIG. 8 shows how densely packed the available Rydberg transitions are for $^{133}$Cs, especially if the principle quantum numbers for the source and destination stats are allowed to differ by more than unity. In other embodiments, other isotopes of rubidium and cesium may be used, other alkali atoms may be used, and non-alkali atoms may be used. More generally, a variety of neutral and charged atoms and molecules may be used as the cloud particles.

Figure 9:
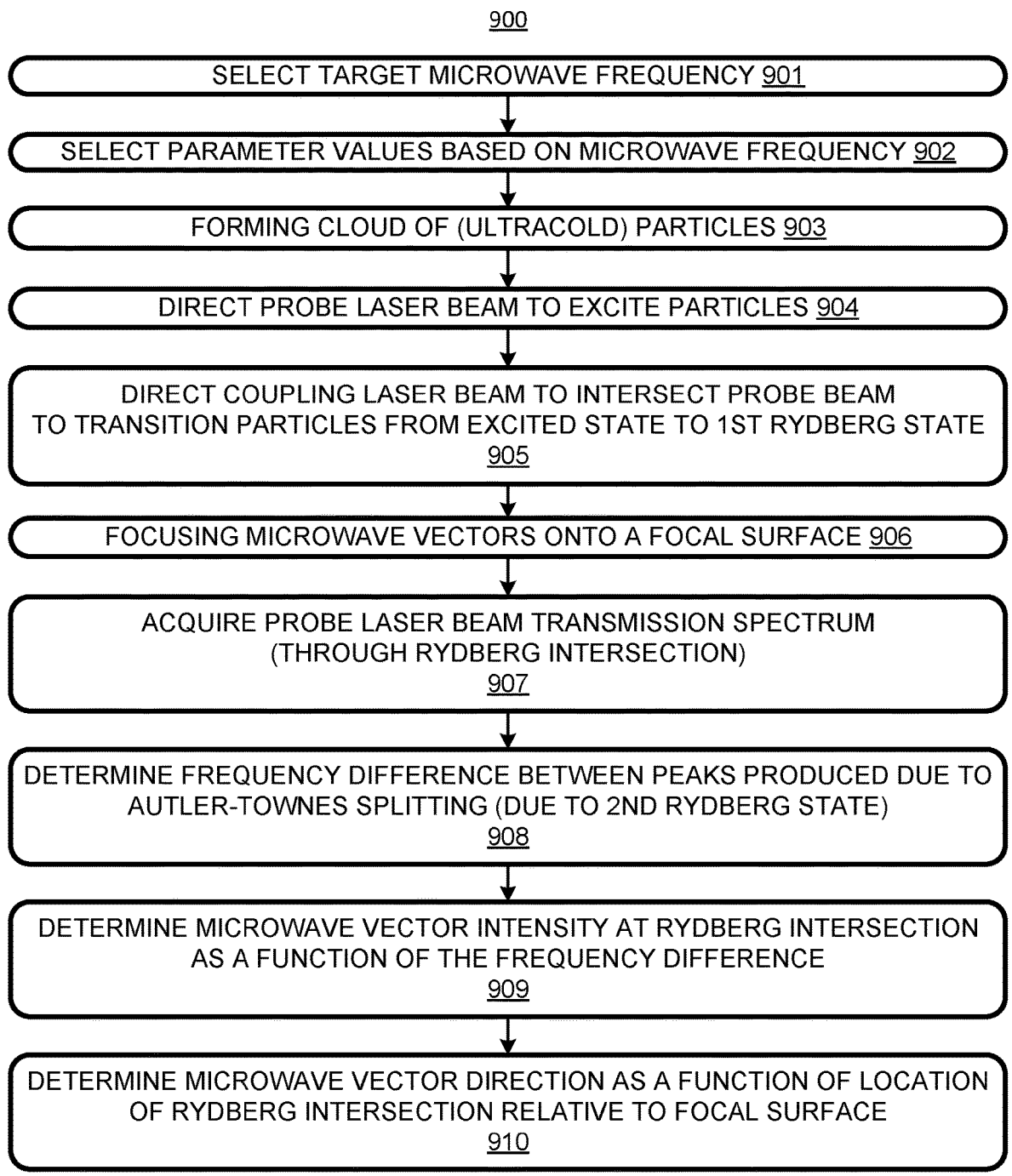
FIG. 9 is a flow chart of a process for determining vector direction and intensity using the sensor of FIG. 1 and other systems.

A microwave vector characterization process 900 is flow charted in FIG. 9. At 901, a target microwave frequency (e.g., used by certain medical or communications equipment) or frequency range (e.g., an ITU band) is selected. At 902, various parameter values are selected based on the selected frequency or range. For example, the pitch (center-to-center spacing) of lenslet elements of a DLA can be selected to sample signals at the Nyquist limit. The number of elements in the lenslet array can affect the cross-sectional dimensions of a particle-cloud cell. In addition, a suitable set, e.g., pair, of Rydberg states must be selected based on the selected frequency or range; this implies a selection of a particle species that has those Rydberg states. Then, the laser wavelengths can be selected to produce a first of the Rydberg states from which a second Rydberg state can be reached due to the imposition of a microwave vector of the target frequency.

At 903, a cloud of particles is formed. In general, this cloud is formed in a chamber; the cloud may fill the chamber or be confined, e.g., by a MOT or optical trap, to a portion of the chamber. The particles can be charged or neutral atoms or molecules that can support Rydberg states with high dipole moments. For example, the particles can be isotopes of alkali atoms such as $^{87}$Rb or $^{133}$Cs. Depending on the embodiment, the particles may be thermal, cold (below one milliKelvin, or ultracold (below 1 microKelvin). In the latter two cases, the cloud formation includes cooling the particles, e.g., using laser cooling and/or evaporative cooling in a MOT or optical trap.

At 904, a probe laser beam is directed through the cloud and toward a camera or other imaging device. As it passes through the cloud, the probe laser beam can excite particles from a ground or other relatively low energy state to an intermediate energy excited state.

Concurrently, at 905, one or more coupling laser beams can be directed into the cloud so that they intersect the probe laser beam. The effect is to transition particles from the excited state to a first Rydberg state. The intersecting laser beams can establish an electromagnetically induced transparency (EIT) at the probe laser frequency. In the absence of a microwave field, a detector or camera can detect a transmission peak at the probe laser wavelength.

At 906, microwave vectors of the target frequency are focused onto a focal surface within the particle cloud. Depending on the microwave lens employed, it can be far-field or near-field signals that are focused. The microwave lens, e.g., a DLA, can be dimensioned for a particular frequency range or band of interest. A microwave signal focused on a spot on the focal surface within the Rydberg intersection causes particles in the first Rydberg state to transition to a second Rydberg state. This results in an Autler-Townes splitting of the EIT transmission peak into a pair of peaks, one at a higher frequency than the original transmission peak and another at a lower frequency than the original transmission peak.

At 907, a transmission frequency spectrum for the probe laser beam (after it has passed through the Rydberg intersection) is obtained. For example, frequency scanner 134 (FIG. 1) can sweep the frequency of probe laser beam through a range including both Autler-Townes peaks. Camera 110 can capture the resulting frequency spectrum. In an alternative embodiment, the "camera" can be a detector with a lens and a pinhole to spatially filter.

At 908, the spectrum is analyzed, e.g., by image analyzer 112, to determine the frequency difference between the Autler-Townes peaks. At 909, this frequency difference is used to calculate the microwave field strength at the Rydberg intersection. The direction of the vector is determined from the location of the Rydberg intersection relative to the focal surface. At 910, the Rydberg intersection is moved relative to the focal surface to obtain a microwave power distribution across the focal surface, and thus the field strengths and directions of microwave vectors captured by the microwave sensor.

Herein, "Rydberg particle" refers to any particle (neutral atom, ion, neutral or charged molecule, though commonly an alkali atom) species in which an outer electron is excited to a high-lying state. In this state the particle has a very large electric dipole moment and can provide substantial sensitivity for detection of a microwave field. Indeed, Rydberg particles can be used to measure microwave electric field amplitudes with unprecedented precision, accuracy, and spatial resolution.

Capable of operating over the microwave range, the technique of Rydberg electrometry offers a host of benefits over measurements performed with antennas and even other quantum technologies. Signal processing can be used to manipulate and detect focal point, polarization, and phase information about an incident microwave vector. For example, a room-temperature Rydberg-atom gas produced from a 1 cm$^3$ volume of alkali metal vapor (e.g. Rb or Cs) is sensitive enough to detect electric-field amplitudes below 1 nV/cm, or three orders of magnitude greater than dipole antennas of comparable volume. Since Rydberg electrometry is based upon the internal structure of particles, e.g., atoms, it is intrinsically accurate, eliminating the need for relative standards and periodic instrument calibration. Rydberg electrometry has also achieved spatial resolutions approaching $\lambda/1000$ ($\lambda$ is the wavelength of the microwave vector), far better than the $\lambda/2$ or $\lambda/4$ resolutions attainable with antennas. In an embodiment, a DLA with a known polarization is used so that the amplitude of the electric field in the given polarization can be detected. Rydberg particles can be used to measure microwave polarization to better than 1°.

Laser cooling is used to cool the Rydberg atoms to microkelvin (μK) temperatures to improve their microwave-field detection performance by minimizing Doppler effects from the atomic motion, by providing exquisite thermal isolation of the measurement sample from its environment, and by increasing the numeric density of atoms that contribute to the EIT signal. In this context, the cold atom ensemble further enables the performance of the system by providing a detection medium that is sensitive to spatial variations in the focused microwave field.

In contrast to superconducting devices, which require an entire physical structure to be cooled (typically to liquid-helium temperatures, or sometimes liquid-nitrogen in the case of high-Tc superconductors), laser cooling can be used to cool only the atoms. Laser cooling requires quite low optical power from diode lasers, on the order of a few tens of milliwatts (mW), and can be performed in vacuum chambers with only a few cubic centimeters of usable volume, thus allowing overall system size, weight, and power consumption (SWaP) to remain small.

Measurements with Rydberg atoms relate to a measurable quantity that is intrinsic to the atom. Since atoms are universal (i.e., their properties are the same everywhere), measurements based on their properties are not only very accurate and stable, but are reproducible everywhere, even in space. For this reason, atom-based sensors can be considered "self-calibrating".

The illustrated microwave sensor design is conducive to miniaturization and portability due to the small size of high-density cold-atom-clouds that can be generated. Additionally, the small size of the sensor minimally perturbs the microwave field to be measured. Finally, the method is valuable as a completely different approach to measure electric fields and allows for cross-checking between the different approaches.

Measurement using Rydberg atoms allows the conversion of a physical quantity into a frequency. Frequencies are straightforward to measure with high accuracy. For example, Autler-Townes splitting of ~10 MHz (MegaHertz) can be measured with relative ease to the part-per-million level, contributing negligibly to the uncertainty of electric field strength $E_0$. This sensitivity is reflected by the large coupling strength for microwave transitions between Rydberg states.

Rydberg atoms have transition dipole moments orders of magnitude greater than lower lying transitions. These enormous dipole moments give Rydberg atoms their sensitivity to electromagnetic fields in the microwave (including the millimeter) regime. The large dipole moments are also a direct result of the large distances between the valence electron and the core. Classically, a dipole moment increases linearly with the distance between charges. Quantum mechanically, the dipole moment increases as $n^2$, where n is the principle quantum number of the valance electron.

The minimum field $\sigma_E$ that can be measured is limited by the number of atoms. Assuming no correlations between the atoms, the shot-noise limit is given by $$\sigma_E = \frac{\hbar}{\mu\sqrt{N\tau T_2}},$$

where N is the number of atoms, $\tau$ is the integration time, and $T_2$ is the dephasing time of the EIT process. As a numerical example, consider the $53D_{5/2} \rightarrow 54P_{3/2}$ transition in $^{87}$Rb at 14.233 GHz. Let $T_2 \sim 200$ μs and $\mu=3611 e \cdot a_0$ (e is the electron charge and $a_0$ is the Bohr radius).

To estimate the number of atoms, one can consider a cubic cell with an internal volume of (100 μm)3=10-12 m3. At 80° C., the vapor pressure of rubidium is 5×10-5 Torr, corresponding to a density of 1.5×1012 cm-3. Taking into account the 28% relative natural abundance of 87Rb, and assuming that only 1/400 of the atoms interact with the lasers due to Doppler shifts, the effective number of atoms is N≈103. The resulting sensitivity is $$\sigma_E \approx 460 \frac{pV}{cm\sqrt{Hz}}.$$

Due to systematic effects (e.g. Doppler shifts, transit-time broadening, residual Zeeman shifts, laser intensity noise), this shot-noise limit cannot be reached easily. Nevertheless, measurements as low as 8 μV/cm have already been achieved.

The dependency of $\sigma_E$ on atom number is crucial for system design, as this value decreases rapidly with cell size. In fact, for a characteristic cell size of 100 μm, the effective number of atoms is only 10 (at room temperature), far too small to observe. For this reason, we assume a heated cell in the above calculation, as this increases the vapor pressure (i.e. atom number). The low atom density in "hot" atom systems puts a limit to the miniaturization of the system. Laser cooling and trapping offers a viable option to increase the density of atoms while reducing the size of the instrument.

Cooling the atoms to temperatures below a few hundred μK overcomes the systematic effects arising from the Doppler effect seen in "hot" atom devices. More specifically, reducing the temperature by four to six orders of magnitude reduces the width of the atoms' velocity distribution by the square root of this factor, or two to three orders of magnitude. This, in turn, reduces Doppler frequency shifts to values below the natural linewidth of the atoms. From this point of view, the laser beams can pass through the Rydberg atoms from any direction, removing constraints to a counter-propagating geometry.

Other benefits of Rydberg-atom-based electrometry over other techniques are: 1) it directly gives the field strength in terms of a frequency measurement, fundamental constants, and known atomic parameters; 2) it provides radio frequency electric field measurements independent of current techniques; 3) since no metal is present in the probe, the probe causes minimal perturbations of the field during the measurement; 4) it can be used to measure both very weak and very strong fields over a large range of frequencies (field strengths as low as 0.8 mV/m have been measured, and below 0.01 mV/m are possible; and 5) it allows for the construction of very small and compact systems (optical fiber and chip-scale systems are possible).

In conventional laser measurement schemes, it is possible to obtain high spatial resolutions, but only in two dimensions (perpendicular to the lasers' axes). The lasers (and possibly the photodetector, if it is very small) need to be scanned to extract the information, and the technique is most useful when the direction of travel of the microwave field is already known.

By using a CCD camera instead of a photodetector and using a discrete lens array (DLA), one can use the images of the probe beam to obtain a three-dimensional scan of the amplitude of the electric-field and its direction of travel in one single measurement shot. An analytical model can be used to estimate the performance of the direction-finder. In the illustrated embodiment, the calculations correspond to a microwave vector of 104.7 GHz (wavelength of 2.87 mm). The calculations take into account the resolution of the imaging system (CCD camera) as well as the focusing parameters of the DLA. The position of the bright spot in the figure can be mapped to the direction of travel of the incoming microwave vector. According to these calculations, it is possible to determine the direction of travel of the incoming microwave vectors to better than half a degree.

The DLA (microwave lens) focuses a received microwave vector to a location within the Rydberg intersection so as to split a transmission peak of the probe laser beam as it passes through the intersection. The frequency difference ($\Delta f$) between the peaks resulting from the Autler-Townes (AT) splitting is proportional to the amplitude of the received microwave vector. Thus, the amplitude of the microwave vector can be determined from a frequency spectrum obtained by frequency sweeping the probe laser beam as it is transmitted through the Rydberg particles. The direction of the received microwave vector can be determined as a function of the location of the laser-beam intersection (e.g., relative to the focal surface of a microwave lens used to focus the microwave vector).

The purpose of the DLA is to receive and focus incoming microwave radiation into the volume of a cloud of cold Rydberg atoms. Depending on the direction of travel of the incoming microwave vector, the DLA focuses the microwave vector onto different locations inside the atom cloud. The resolution of propagation direction finding depends on the size of the lens, but also on the radiation pattern of the detector antenna elements placed along the focal surface. Some patch antennas used for detecting have effective areas that are on the order of a square wavelength.

Adaptive-array direction finding algorithms require a much smaller number of weights than in the case of a standard phased array due to the DFT analog front-end processing of the lens. This in turn means lower-energy processing. Other algorithms that can easily be implemented using the same lens include jammer-suppression and adaptive scanning.

The loss in the lens feed in receive mode is not thermal in nature, except for losses in the metal and dielectric of the lens itself and include spillover loss and focusing loss. The loss can be compensated by adding low-noise amplifiers (LNAs) in each element of the lens in receive mode, and/or power amplifiers (PAs) in transmit mode. In the receive mode, the signal combines coherently and the noise incoherently, increasing the dynamic range. In the illustrated embodiment, no amplification is used.

Although N quasi-orthogonal beams are in reality possible in an N-element lens, the number of different beams includes all linear combinations of these N beams. Some of these are useful for direction finding, e.g., by using two receivers on the focal surface symmetrical around the optical axis and in phase, a null is formed on broadside and can be used in a monopulse mode.

To image electric fields in three spatial dimensions with microwave sensor 100 (FIG. 1), one must selectively probe different spatial regions of the cold-atom cloud. In the one-dimensional case, the measured image of the field gives a mapping of the field intensity over the whole cloud, which translates to a single direction. In this scheme, the position of the lasers and the camera with respect to the DLA chip and the cloud of cold atoms determines what spatial information one can obtain. To measure the field in three dimensions, one can determine the position of the field's focal point within the volume of the cold atom cloud.

Figure 10A:
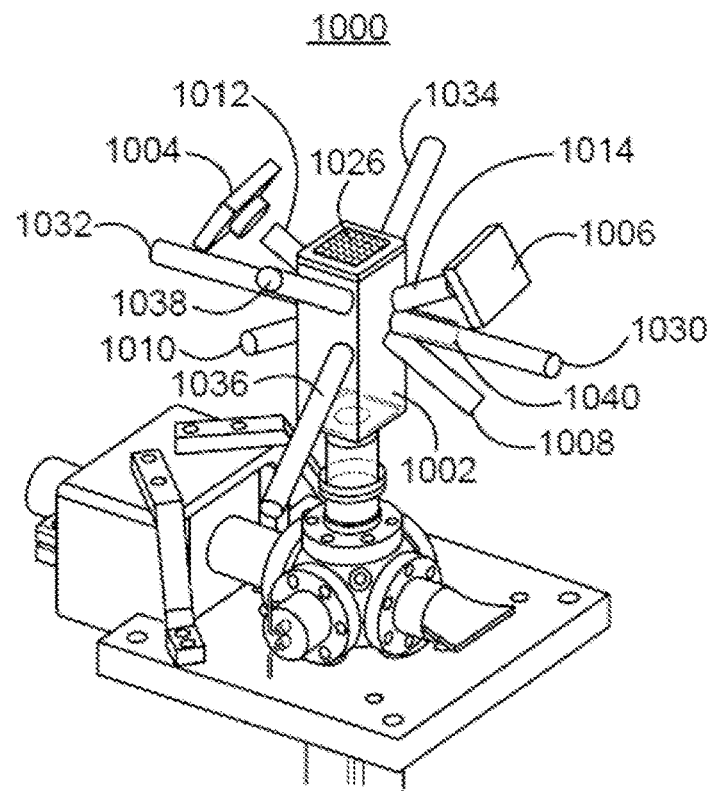
FIG. 10A is a schematic perspective view of a 3D microwave sensor system for obtaining a three-dimensional intensity profile of a microwave field.
Figure 10B:
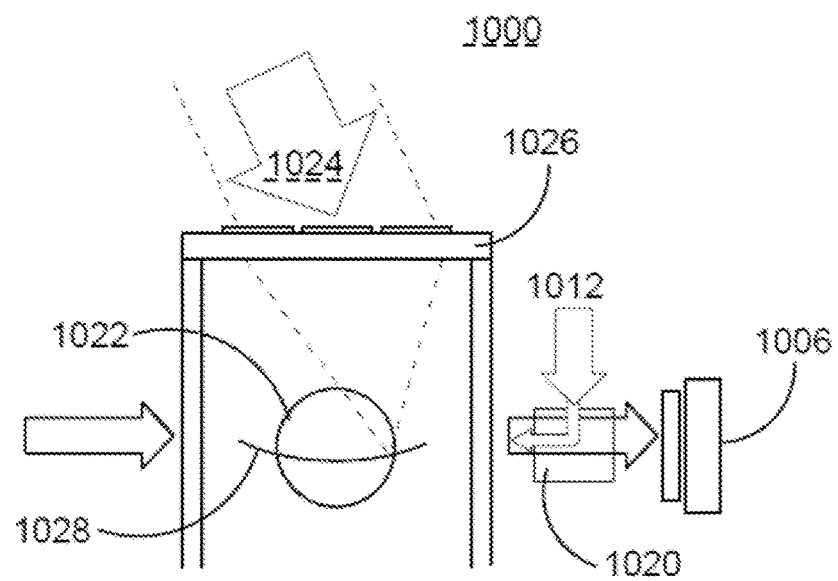
FIG. 10B is a schematic illustration of the 3D sensor system of FIG. 10A showing a dichroic mirror used to align a probe laser beam and a coupling laser beam so that they counter-propagate.

FIG. 10A shows a three-dimensional microwave sensor 1000, which allows for system imaging from multiple directions to establish a three-dimensional field measurement. Sensor 1000 includes a vacuum cell 1002, in which a cloud of particles is formed. Cameras 1004 and 1006 can be used to capture frequency spectra for two different probe beams 1008 and 1010, which are directed in different directions through vacuum cell 1002. Coupling beams 1012 and 1014 are directed collinearly with and opposite to probe beams 1008 and 1010 respectively. The collinearity is achieved using a beam-splitting mirror 1020, as shown in FIG. 10B, which also shows the particle cloud 1022, an incoming microwave vector 1024, a microwave lens 1026, and a focal surface 1028 of the microwave lens. MOT laser beams 1030, 1032, 1034, 1036, 1038, and 1040 (FIG. 10A) are used to form a three-dimensional MOT used to confine the particle cloud and concentrate its constituent particles.

Using only one camera (e.g., camera 1006 in FIGS. 10A and 10B), one can extract the spatial information (direction of travel) of the incoming microwave signal in one direction. By using multiple cameras (e.g. cameras 1004 and 1006 in FIG. 10A) positioned at appropriate angles, and by selectively probing the atoms at discrete volumes within the cloud, it is possible to measure the full vector information of the incoming microwave signal (electric field strength and direction of travel) in all three spatial dimensions. Microwave sensor 1000 dynamically adjusts the beam pointing of the probe and coupling lasers. Beam rastering can be accomplished using steering elements, such as holograms, acousto-optic modulators, spatial light mirrors, or deformable optics.

Figure 10C:
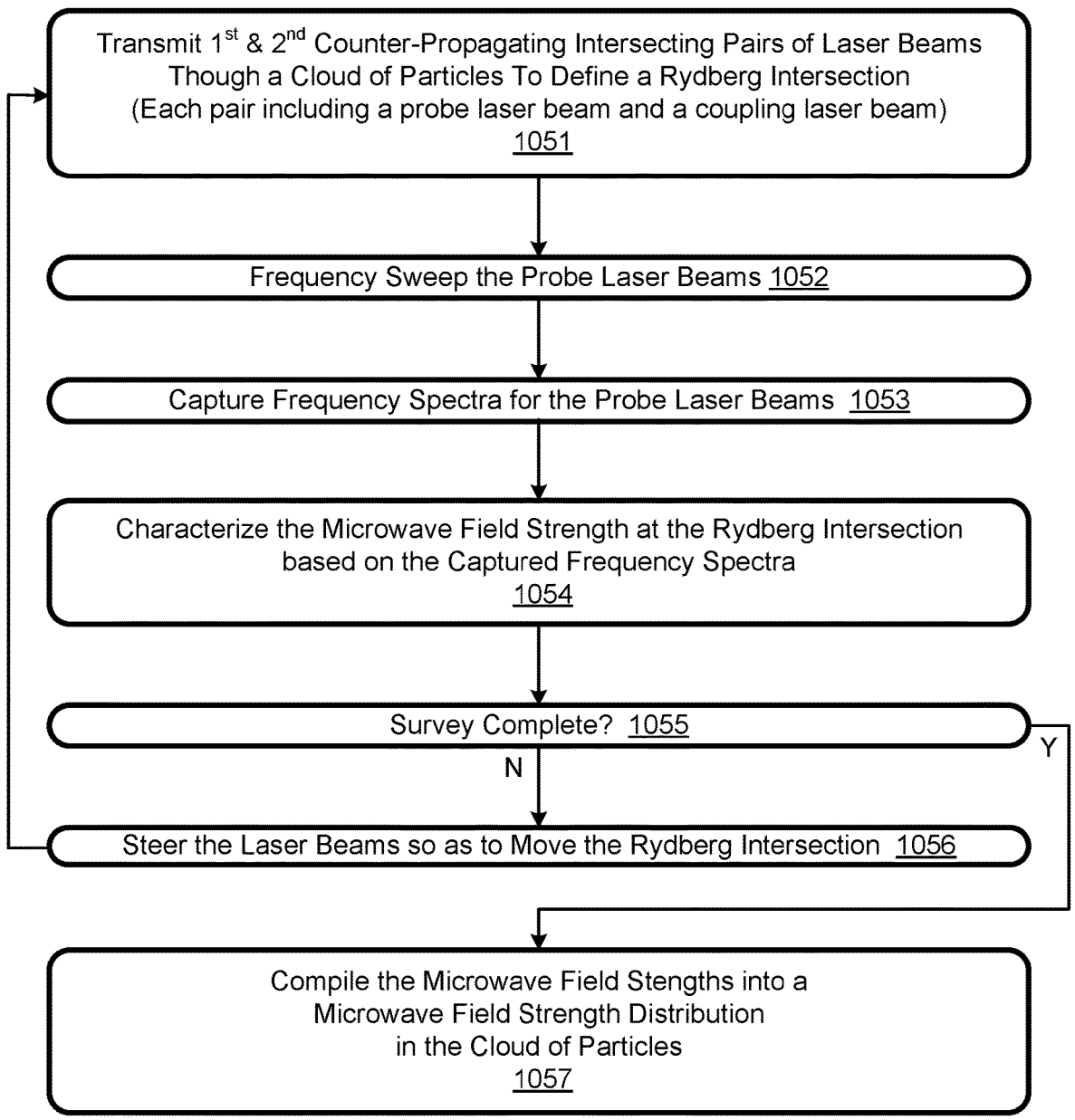
FIG. 10C is a flow chart of a 3D microwave sensor process implementable using the 3D microwave sensor system of FIG. 10A.

A 3D microwave sensor process 1050 is flow-charted at FIG. 10C. At 1051, two pairs of laser beams are transmitted through a cloud of particles such as $^{87}$Rb atoms. The first pair includes a first probe beam and a first coupling beam which are counter-propagated along a first path through the particle cloud. The second pair includes a second probe beam and a second coupling beam which are counter-propagated along a second path through the particle cloud. The first and second paths intersect to define a Rydberg intersection.

The frequencies of the probe laser beams are swept at 1052, and the resulting frequency spectra are captured at 1053. The microwave electric field strength of the Rydberg intersection can be determined based on the captured frequency spectra.

At 1055, a determination is made whether the "scanning" is complete. If the distribution of microwave strength throughout the particle cloud is desired, the laser beams can be steered to raster or otherwise move the Rydberg intersection to discrete volumes within the particle cloud to capture spectra and then determine microwave field strengths at the different positions. Until the last position is evaluated, the survey is incomplete and process 1050 returns for a further iteration of actions 1051-1054. Once the scanning is complete, the microwave field strengths can be compiled at 1057 to obtaine a microwave electric field strength distribution within the particle cloud.

Sensors 100 and 1000 of FIGS. 1 and 10A, respectively, use laser cooling to cool the Rydberg atoms to microkelvin temperatures to improve their microwave-field detection performance by increasing local atom number density, by minimizing Doppler effects from the atomic motion, and by providing exquisite thermal isolation of the measurement sample from its environment. This approach offers significant advantages in the sensitivity and resolution of existing Rydberg particle-based field sensors. However, the invention provides for embodiments without laser cooling where these advantages are not required.

Figure 11A:
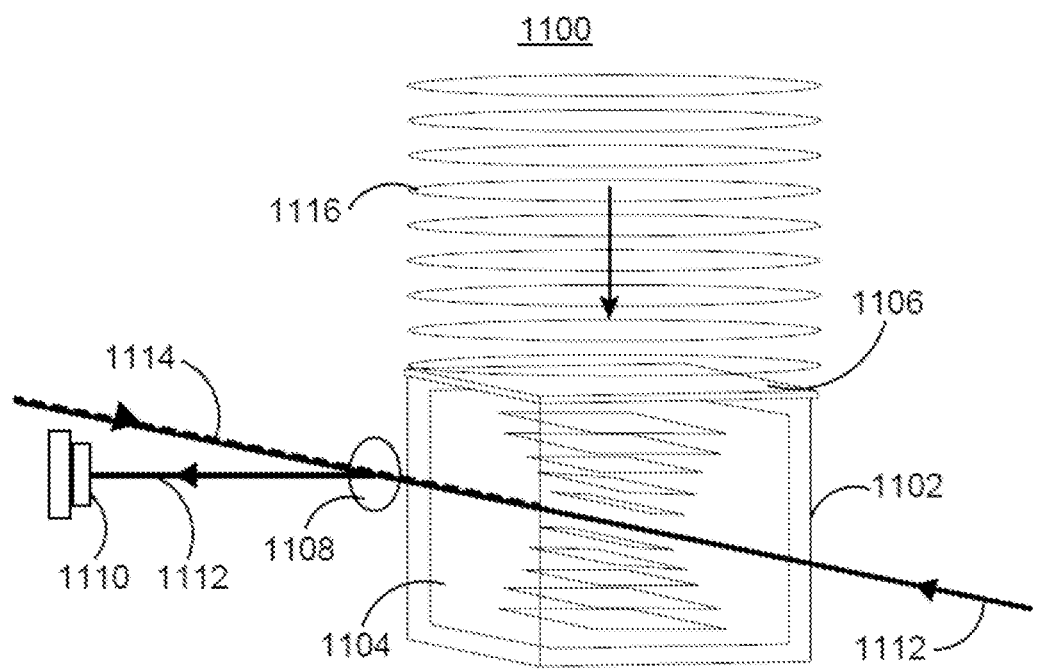
FIG. 11A is a schematic illustration of a sensor using thermal particles (as opposed to cold particles).

A sensor system 1100, shown in FIG. 11A, which represents an economical instrument useful in less demanding applications, implements a direction finder in a sample of un-cooled thermal atoms. Microwave sensor 1100, includes a hot vapor cell 1102 filled with a hot vapor 1104, e.g., a thermal vapor of rubidium atoms, a DLA microwave lens 1106, a dichroic mirror 1108, and a detector 1110, as well as a laser system (not shown). Dichroic mirror 1108 is used to divert a probe laser beam 1112 away from a counter-propagating pump laser beam 1114 and towards detector 1110. In a variation, a long, dense cloud is formed and used to make a one-dimensional sensor; resulting in a dramatic increase in signal-to-noise ratio.

Microwaves 1116 are incident on DLA 1106 with bilateral symmetry, forming a cylindrical lens. DLA 1106 focuses the radiation down to a line of maximal field intensity, which, in the case of a normally incident microwave, is overlapped with a probe laser beam 1112 and a counter-propagating pump laser beam 1114. The optical field couples the atoms in the hot vapor to electronic states that are sensitive to the microwave field, which results in a measurable change in the atomic spectroscopy.

Figure 11B:
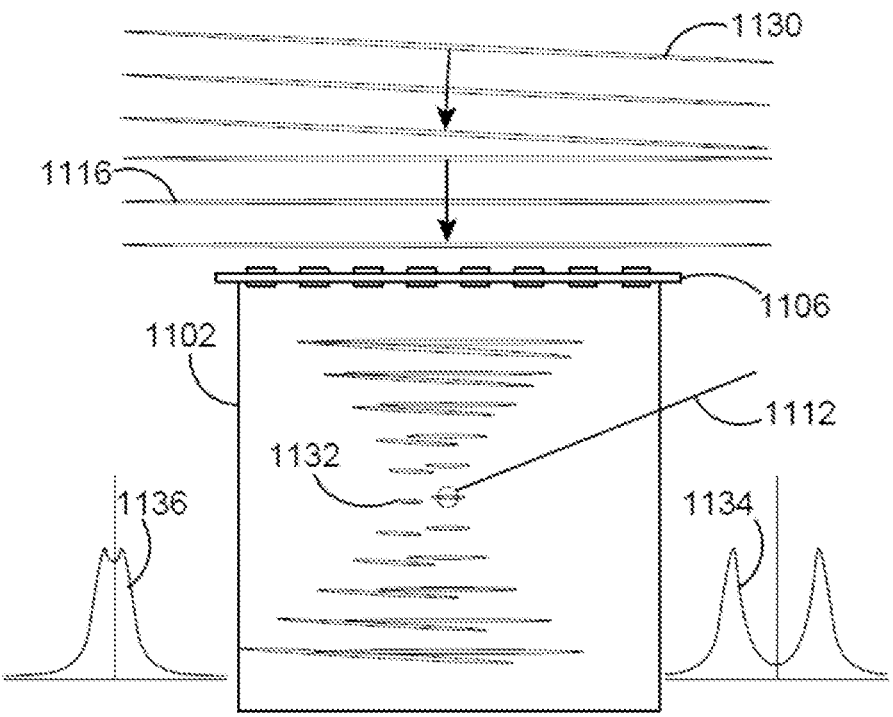
FIG. 11B is a schematic illustration of the sensor of FIG. 11A showing how the frequency spectra resulting from on-axis and off-axis incident microwave vectors differ.

In the case of the incoming microwave radiation 1130, FIG. 11B, being not normal to the surface of the DLA 1106, the DLA focuses the microwaves onto a point 1132 located some distance away from a central axis, proportional to the incident angle of the radiation. As this happens, the measured atomic spectrum will change according to the change in angle of the radiation. An on-axis spectrum 1134 with clearly separated peaks and an off-axis spectrum 1136 with overlapping peaks are shown in FIG. 11B. Microwave sensor 1100 can produce an image of the complete spatial spectrum of the measurement region to provide high-bandwidth direction information without the need to physically move the device with respect to the incoming wave. The visible aperture can be increased by using greater power in the pump beam.

Herein, a "cloud" is a collection of separate particles confined to a region of space. The particles may be in a "gas" phase, wherein "gas" encompasses Bose gases and Fermi gases, as well as traditional gases, e.g., room-temperature vapors of neutral atoms, ions, or molecules. Herein, the "particles" can be sub-atomic particles (Bosons, Hadrons, or Fermions), neutral atoms, charged atoms (ions), neutral molecules, or charged molecules (also, "ions").

Herein, a "microwave vector" is a propagating electric field with a characteristic frequency between 300 MHz and 3 THz, a propagation direction corresponding to the vector orientation, and a field strength corresponding to the vector magnitude. Additional characteristics of a microwave vector can include polarization and phase. Note that these characteristics may be constant or time varying. An information-bearing microwave vector can be a microwave signal. Microwave vectors can overlap with a volume to collectively constitute an electric field distribution for the volume. Herein, a "cell" is a device for isolating contents within the cell from an environment outside the cell.

Herein, all art labeled "prior art", if any, is admitted prior art; all art not labeled "prior art", if any, is not admitted prior art. The illustrated embodiments, variations thereupon and modifications thereto are provided for by the present invention, the scope of which is defined by the following claims.

What is claimed is:

1. A microwave sensing system comprising:
   a vacuum cell for isolating a plurality of quantum particles from an external environment;
   a laser system configured to provide a probe beam and a coupling beam directed through the plurality of quantum particles, a frequency of the probe beam being settable within a plurality of frequencies; and
   a capture system configured to capture a frequency spectrum for the probe beam;
   wherein a microwave having a microwave frequency and a microwave electric field strength transits the plurality of quantum particles and intersects the probe beam and the coupling beam in a region, the capture system capturing the frequency spectrum in the region, the microwave altering the frequency spectrum in the region based on the microwave electric field strength; and
   wherein the microwave induces Autler-Townes peaks in the frequency spectrum due to Autler-Townes splitting, a frequency difference between the Autler-Townes peaks characterizing the microwave electric field strength of the microwave.

2. The microwave sensing system of claim 1, further comprising:
   a spectrum analyzer for characterizing the microwave electric field strength in the region based on the frequency spectrum.

3. The microwave sensing system of claim 1, wherein the laser system includes a probe laser that provides the probe beam, a coupling laser that provides the coupling beam, and a frequency scanner that sets the frequency of the probe beam.

4. The microwave sensing system of claim 1, wherein the probe beam is configured to excite the plurality of quantum particles to a first state and the coupling beam is configured to excite the plurality of quantum particles from the first state to a first Rydberg state, the microwave frequency corresponding to a transition of the plurality of quantum particles from the first Rydberg state to a second Rydberg state.

5. A microwave sensing system comprising:
   a vacuum cell for isolating a plurality of quantum particles from an external environment;
   a laser system configured to provide a probe beam and a coupling beam directed through the plurality of quantum particles, a frequency of the probe beam being settable within a plurality of frequencies;
   a capture system configured to capture a frequency spectrum for the probe beam; and
   at least one steering element for steering the probe beam, the coupling beam, an additional probe beam, and an additional coupling beam to move a region and characterize a microwave field strength distribution in the plurality of quantum particles;
   wherein a microwave having a microwave frequency and a microwave electric field strength transits the plurality of quantum particles and intersects the probe beam and the coupling beam in the region, the capture system capturing the frequency spectrum in the region, the microwave altering the frequency spectrum in the region based on the microwave electric field strength; and
   wherein the probe beam and the coupling beam counter-propagate along a first path, the laser system being configured to provide the additional probe beam and the additional coupling beam counter-propagating with the additional probe beam along a second path, the first path and the second path intersecting at the region.

6. The microwave sensing system of claim 1, wherein the plurality of quantum particles are ultra-cold quantum particles.

7. A method, comprising:
directing a probe beam and a coupling beam through a plurality of quantum particles, a frequency of the probe beam being settable within a plurality of frequencies, a microwave transiting the plurality of quantum particles, the microwave having a microwave frequency and a microwave electric field strength, the microwave intersecting the probe beam and the coupling beam in a region; and
capturing a frequency spectrum for the probe beam in the region;
wherein the microwave alters the frequency spectrum based on the microwave electric field strength; and
wherein the microwave induces Autler-Townes peaks in the frequency spectrum due to Autler-Townes splitting, a frequency difference between the Autler-Townes peaks characterizing the microwave electric field strength of the microwave.

8. The method of claim 7, further comprising:
sweeping the frequency of the probe beam.

9. The method of claim 7, wherein the probe beam and the coupling beam counter-propagate along a first path, the method further comprising:
directing an additional probe beam and an additional coupling beam counter-propagating with the additional probe beam along a second path, the first path and the second path intersecting at the region.

10. The method of claim 9, further comprising:
steering the probe beam, the coupling beam, the additional probe beam, and the additional coupling beam to move the region and characterize a microwave field strength distribution in the plurality of quantum particles.

11. The method of claim 7, wherein the plurality of quantum particles are ultra-cold quantum particles.

* * * * *